United States Patent
Higashitani et al.

(10) Patent No.: US 6,346,737 B1
(45) Date of Patent: *Feb. 12, 2002

(54) SHALLOW TRENCH ISOLATION PROCESS PARTICULARLY SUITED FOR HIGH VOLTAGE CIRCUITS

(75) Inventors: Masaaki Higashitani, Sunnyvale; Hao Fang, Cupertino, both of CA (US)

(73) Assignees: Advanced Micro Devices, Inc., Sunnyvale, CA (US); Fujitsu Limited, Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/109,755

(22) Filed: Jul. 2, 1998

(51) Int. Cl.[7] .................... H01L 29/00; H01L 29/788; H01L 23/58
(52) U.S. Cl. .................... 257/511; 257/315; 257/316; 257/500; 257/510; 257/647
(58) Field of Search .................. 257/316, 315, 257/500, 510, 511, 513, 515, 647; 438/425

(56) References Cited

U.S. PATENT DOCUMENTS

| | | | |
|---|---|---|---|
| 5,665,616 A | * | 9/1997 | Kimura et al. ............... 438/234 |
| 5,679,599 A | | 10/1997 | Mehta ........................ 438/425 |
| 5,966,598 A | * | 10/1999 | Yamazaki ................... 257/511 |
| 5,994,733 A | * | 11/1999 | Nishioka et al. ............. 257/316 |

FOREIGN PATENT DOCUMENTS

| | | | | |
|---|---|---|---|---|
| JP | 7-193200 | * | 7/1995 | ................. 257/315 |
| JP | 9-45873 | * | 2/1997 | ................. 257/315 |

OTHER PUBLICATIONS

Park et al., "Self–Aligned LOCOS/Trench (SALOT) Combination Isolation Technology Planarized by Chemical Mechanical Polishing", IEDM Technology Digest, P, 675–678, 1994.*

Solid State Technology, Plasma Technology, "High–density plasma CVD and CMP for 0.25–μm intermetal dielectric processing", J.T. Pye, H.W. Fry, W. J. Schaffer, Dec. 1995, 5 pgs.

* cited by examiner

Primary Examiner—Steven Loke
(74) Attorney, Agent, or Firm—Renner, Otto, Boisselle & Sklar, LLP

(57) ABSTRACT

A process which includes forming trench structures (28) in a substrate (12) as part of both the STI isolation structure and the LOCOS/STI isolation structure. Thereafter, a field oxide (34a) is formed which simultaneously forms a portion of the STI isolation structure and a portion of the LOCOS/STI isolation structure. Consequently, three different isolation structures may be formed without requiring a substantial increase in the complexity or number of processing steps.

13 Claims, 3 Drawing Sheets

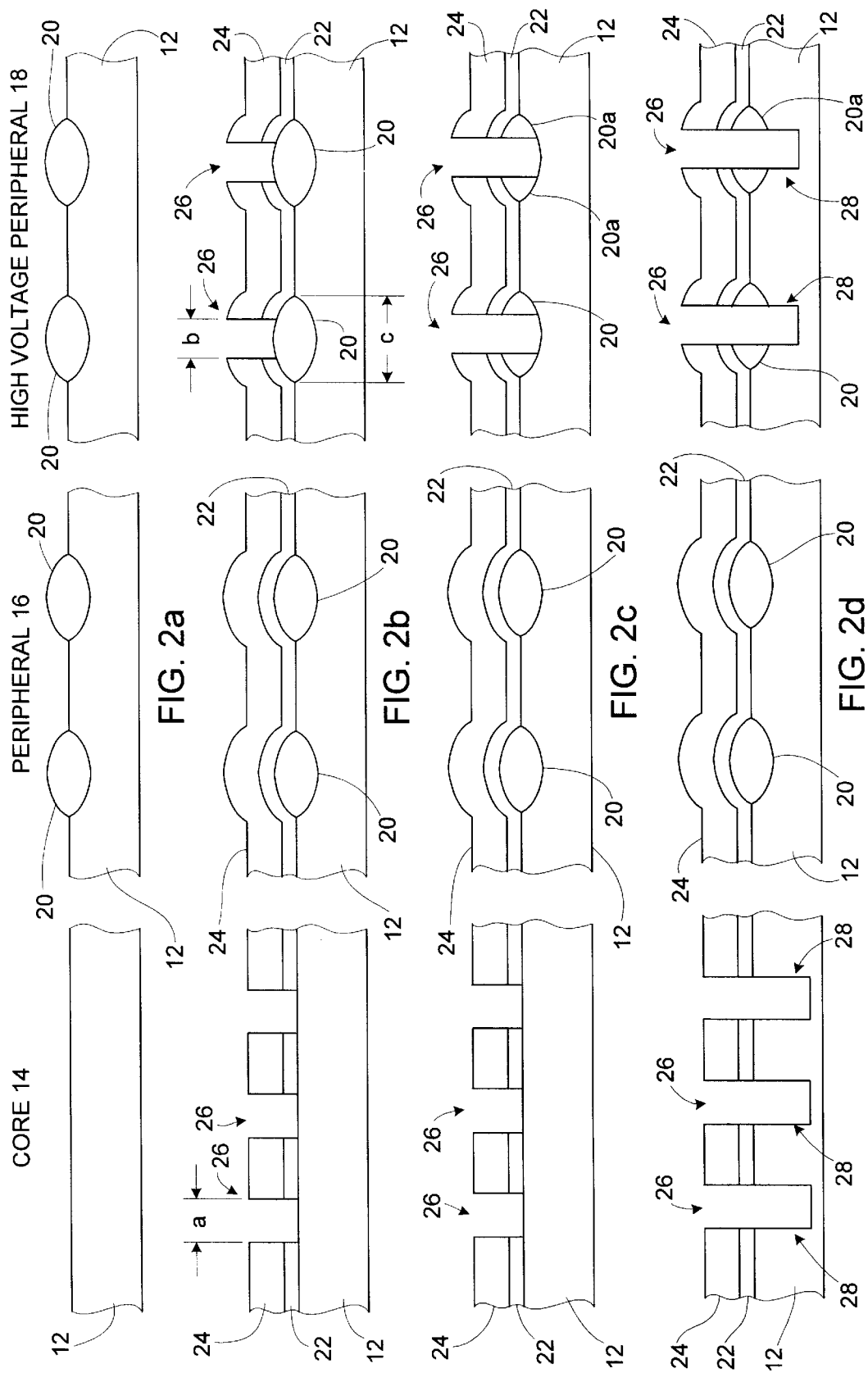

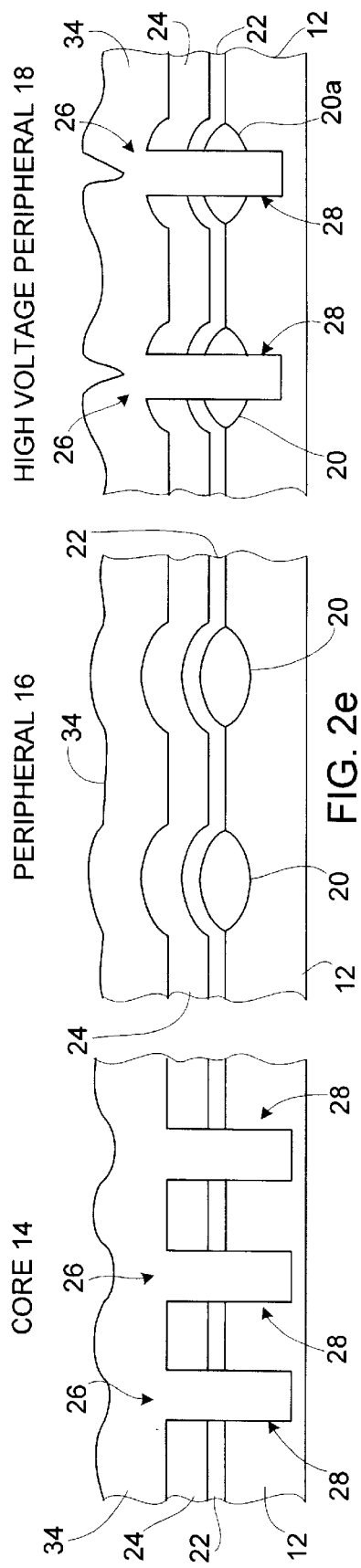
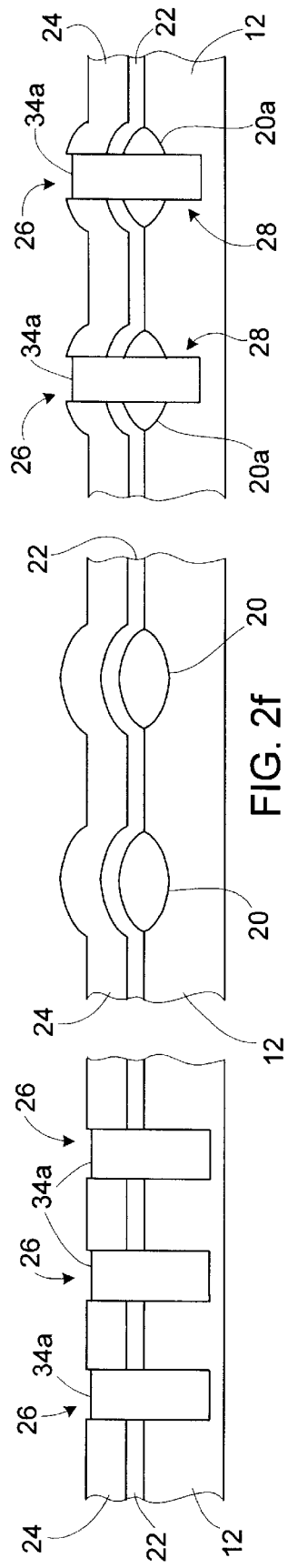
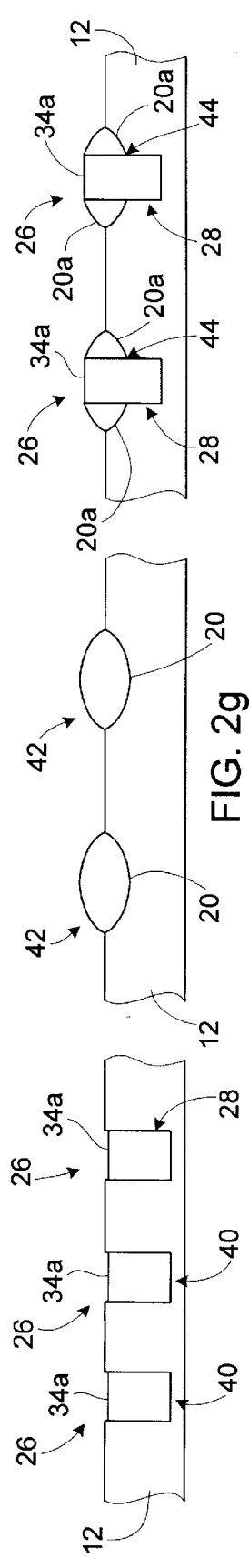
FIG. 2e
FIG. 2f
FIG. 2g

SHALLOW TRENCH ISOLATION PROCESS PARTICULARLY SUITED FOR HIGH VOLTAGE CIRCUITS

TECHNICAL FIELD

The present invention relates generally to isolating active regions in semiconductor devices, and more particularly to shallow trench isolation (STI) processes, local oxidation of silicon (LOCOS) isolation processes, and combinations thereof.

BACKGROUND OF THE INVENTION

In a typical integrated circuit, manufactured on a silicon wafer, the active devices making up the integrated circuit are divided through the use of electrically isolating material. Each of the active devices must be electrically isolated from the adjoining active region to prevent cross-over electrical effects between adjoining devices which would defeat overall operation of the circuit. Each active region is utilized by the integrated circuit manufacturer to form an active device, such as, in CMOS technology, an n-channel or a p-channel transistor. The devices are thereafter connected to a series of metal or metal-alloy interconnect structures to complete the integrated circuit device.

The processing characteristics of LOCOS regions are very well known in the art. Such regions have been in use for a long period of time and there is a great deal of knowledge in the manipulation of such processes.

There are relatively wide variations in LOCOS processes which are utilized to provide isolation between active devices in fabricating integrated circuit products. LOCOS involves growing silicon dioxide by heating an exposed area of silicon (or silicon covered with a thin layer of silicon dioxide) in an oxygen containing ambient. Prior to LOCOS growth, the wafer construct will normally be covered with an inert layer of material, such as silicon nitride ($Si_3N_4$), and the nitride layer is patterned to expose the areas selected for LOCOS formation. The localized regions of oxide are then grown in the exposed areas, and the silicon nitride layer is then removed.

Because LOCOS processes generally occupy a great deal of wafer surface area, alternative isolation structures have been developed. One such process is shallow trench isolation (STI), which involves etching a trench into the substrate, and filling the trench with an isolation material. However, shallow trench isolation is relatively complex because an anisotropic etch must be used to define the trench, the trench must be etched deeply into the silicon, and filling the trench with the isolation material can raise additional processing issues in preparing the integrated circuit.

To further complicate matters, oftentimes an integrated circuit includes several regions each having different electrical characteristics and isolation requirements. For example, a flash type electrically erasable programmable read-only-memory (EEPROM) typically includes a core array and peripheral circuit. The core array is made up of closely spaced transistors. The peripheral circuit includes both standard low voltage transistors and a high voltage peripheral section made up of high voltage transistors. Normally, the core EEPROM operational voltage range is about 10–20 volts while the operational voltage ranges of the low voltage peripheral circuit and the high voltage peripheral circuit is about 1–5 volts and about 12–26 volts, respectively. The high voltage operational voltage range is higher than the core range since the high voltage circuitry is used to generate the core voltage. These different size and voltage constraints make it desirable to provide more than one type of isolation structure between active devices within the same integrated circuit. A drawback is that the combination of such different types of isolation structures can result in an overly complex manufacturing process which is both costly and time consuming.

In view of the aforementioned shortcomings associated with conventional techniques, there is a strong need in the art for a process in which a plurality of different isolation structures may be formed on a substrate. As a particular example, there is a strong need in the art for a process whereby different isolation structures may be respectively formed for closely spaced devices, standard low voltage devices, and high voltage devices without substantial process complications. Even more particularly, there is a strong need in the art for a process for forming such different isolation structures in a flash EEPROM with minimal process complications.

SUMMARY OF THE INVENTION

According to one aspect of the invention, a method for forming isolating regions in a semiconductor substrate is provided. The method includes the steps of forming a first local oxidation of silicon (LOCOS) isolation structure on a surface of the substrate in a first region, and forming a second LOCOS isolation structure on the surface of the substrate in a second region; forming an insulating layer on the surface of the substrate and the first and second LOCOS isolation structures; forming a layer of nitride material on the insulating layer, the nitride material having a surface; patterning the nitride material and the insulating layer to provide an isolation region in the second region by exposing a portion of a surface of the second LOCOS isolation structure, and an isolation region in a third region of the substrate by exposing the surface of the substrate; removing a portion of the second LOCOS isolation structure in the isolation region in the second region to expose a portion of the surface of the substrate in the second region, such that a remaining portion of the second LOCOS isolation structure remains adjacent the isolation region in the second region; forming a trench in each of the isolation region in the second region and the isolation region in the third region, each of the trenches extending into the semiconductor substrate to a depth below the surface of the semiconductor substrate; filling the isolation region in the second region and the isolation region in the third region with an isolation oxide; removing a portion of the isolation oxide to expose the surface of the layer of nitride material, and removing the layer of nitride material such that the LOCOS isolation structure in the first region is exposed and wherein the isolation oxide fills the trench in the isolation region of the second region and the isolation region of the third region with a surface level generally even with the surface of the substrate.

According to another aspect of the invention, a method for manufacturing an integrated circuit on a semiconductor substrate is provided. The integrated circuit includes a first isolation structure including a first trench in a surface of the substrate with isolation material formed within the first trench, a second isolation structure including a first local oxidation of silicon (LOCOS) isolation structure, and a third isolation structure including a second trench in the surface of the substrate interposed between portions of a second LOCOS isolation structure. The method comprises the steps of: (a) forming the first LOCOS isolation structure; (b) forming the second LOCOS isolation structure; (c) forming the first trench in the substrate; (d) forming the second trench in the substrate interposed between portions of a second LOCOS isolation structure; (e) forming the isolation material within the first trench; (f) forming the isolation material within the second trench; and wherein at least one of steps (a) and (b), steps (c) and (d), and steps (e) and (f) are performed simultaneously.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 2a–2g are cross-sections of a silicon device illustrating the process steps utilized in accordance with the isolation process of the present invention in integrated circuits.

DESCRIPTION OF THE PREFERRED EMBODIMENT

Figure 1:
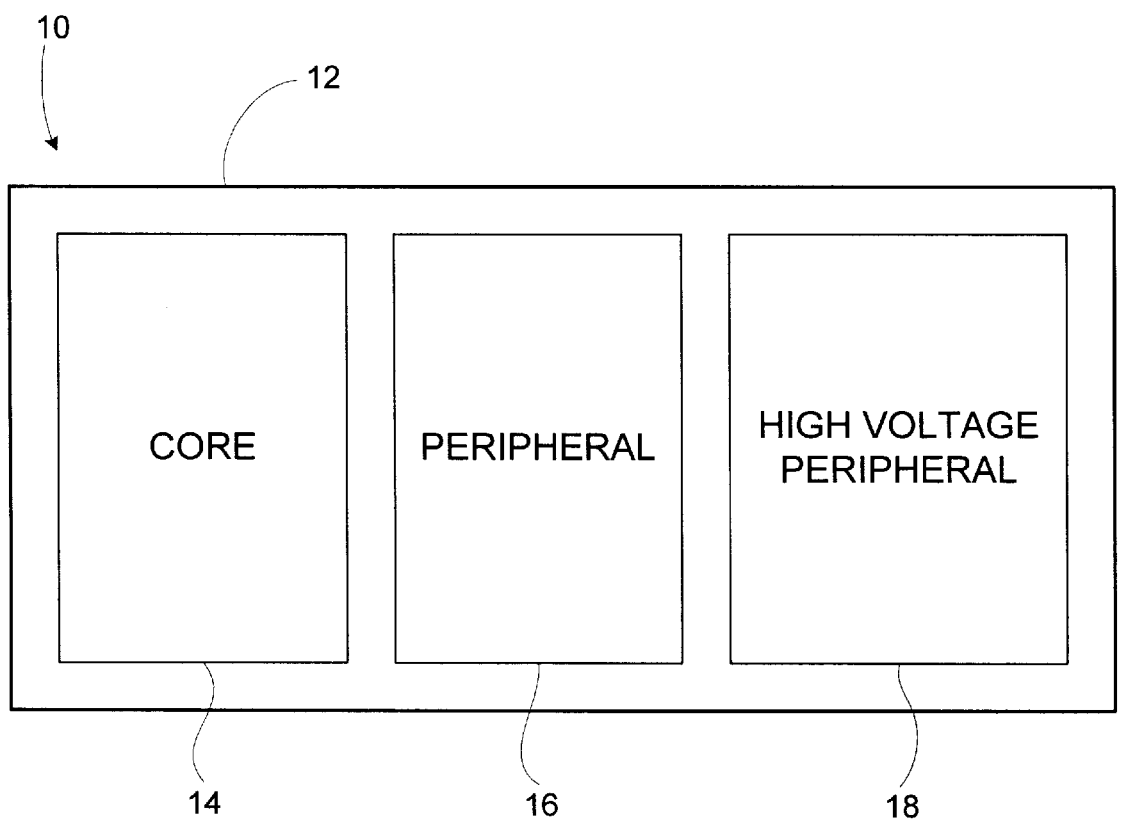
FIG. 1 is a block diagram representing a flash type electrically erasable programmable read-only-memory (EEPROM) incorporating the features of the present invention.

The present invention will now be described with reference to the drawings, wherein like reference numerals are used to refer to like elements throughout.

The invention described herein combines the well-known LOCOS isolation process and structure with the STI isolation process and structure. Specifically, the invention defines a process and structure for individual LOCOS isolation regions, STI isolation regions, and combination LOCOS/STI isolation regions. Through such combination, advantages attendant all three technologies may be employed. The trench isolation structure is useful in densely packed regions where the active spacing is small, such as the core region in a flash EEPROM. The LOCOS isolation structure is useful in regions where conventional LOCOS structure provides adequate isolation and active region spacing is relatively plentiful, such as in the low voltage peripheral circuit portion of a flash EEPROM. The combination LOCOS/STI isolation structure provides increased isolation compared to the preceding techniques, and is useful in regions requiring additional isolation between devices such as in the high voltage peripheral circuit portion of a flash EEPROM.

According to the invention, a field oxide is provided which simultaneously forms a portion of the LOCOS isolation structure and a portion of the LOCOS/STI isolation structure. Moreover, according to the invention trench structures are formed simultaneously as part of both the STI isolation structure and the LOCOS/STI isolation structure. Thereafter, another field oxide is formed which simultaneously forms a portion of the STI isolation structure and a portion of the LOCOS/STI isolation structure. Consequently, three different isolation structures are formed without requiring a substantial increase in the complexity or number of processing steps.

Referring initially to FIG. 1, illustrated is a flash EEPROM integrated circuit 10 which is manufactured in accordance with the process of the present invention. As schematically represented in FIG. 1, the EEPROM 10 is manufactured on a silicon substrate 12 having a core region 14, standard peripheral circuit region 16, and high voltage peripheral circuit region 18 formed thereon. As is known in conventional flash EEPROMs, the core region 14 is made up of an array of core transistors which may be separated from each other by respective isolation regions. The peripheral circuit region 16 may include low voltage transistors such as those used to form a row decoder which is connected to the core array. Each pair of low voltage transistors may have a corresponding isolation region therebetween. The high voltage peripheral circuit region 18 typically includes high voltage transistors designed for use in programming and erase operations. Because of the high voltages presented across the transistors in the region 18, it is desirable to have isolation structures therebetween which offer additional isolation as compared to that which is found in the core region 14 and the low voltage peripheral circuit region 16.

FIGS. 2a–2g represent the process steps associated with manufacturing the isolation regions in the flash EEPROM 10 in accordance with the present invention. The lefthand portion of the figures represents the steps involved in producing STI isolation structures in between devices in the core region 14. The center portion of the figures represents the steps used for producing conventional LOCOS isolation structures between devices in the peripheral region 16. Finally, the right-hand portion of the figures represents the steps involved in the production of LOCOS/STI isolation structures which provide improved isolation between active devices in the high voltage peripheral region 18. It will be appreciated that each figure represents steps which are carried out simultaneously with respect to each of the regions 14, 16 and 18. Moreover, although the invention is described herein primarily in the context of manufacturing a flash EEPROM, it will be appreciated that the present invention has utility as part of the process for making any integrated circuit requiring different types of isolation structures. The present invention is not intended to be limited necessarily to the making of flash EEPROMs.

FIG. 2a shows the semiconductor substrate 12 upon which the various isolation structures for the flash EEPROM 10 are to be formed. The substrate 12 preferably is a monocrystalline silicon substrate having a predetermined concentration of p or n-type impurities. FIG. 2a represents an initial step in which conventional LOCOS isolation structures 20 are simultaneously formed at predesigned locations in the peripheral circuit region 16 and high voltage peripheral circuit region 18. The LOCOS isolation structures 20 are formed using conventional techniques such as those discussed above. The structures 20 are formed on the substrate 12 at locations which will separate active devices that are to be later formed in order to complete the flash EEPROM 10.

Next, as shown in FIG. 2b, a barrier oxide layer 22 and a layer of nitride 24 are formed on the surface of the substrate 12. The oxide layer 22 has a thickness of approximately 200 Å and may be thermally grown at a temperature of approximately 900° Celsius for a period of 40 minutes. The nitride layer 24 is deposited on the surface of the oxide layer 22 using a chemical vapor deposition (CVD) process to a thickness of approximately 2000 Å. A conventional photoresist process is then utilized to pattern and etch the nitride layer 24 and oxide layer 22 in order to result in the structure shown in FIG. 2b. Such a photoresist process includes use of an STI mask which defines isolation regions 26 in the core region 14 and in the high voltage peripheral region 18 where the nitride layer 24 and oxide layer 22 are removed following the nitride etch.

The isolation regions 26 in the core region 14 are located on the substrate 12 at positions which will interpose active devices later formed on the substrate 12. The isolation regions 26 in the core region 14 preferably have a width "a" and the isolation regions 26 in the high voltage peripheral region 18 have a width "b", where a=b. The LOCOS isolation structures 20 in the high voltage peripheral region 18 preferably have a width "c" where c>>b. The center of each of the isolation regions 26 in the high voltage peripheral region 18 is substantially coincident with the center of a corresponding LOCOS isolation structure 20 as shown in FIG. 2b.

An oxide etch is then performed, as represented in FIG. 2c, so as to remove the exposed portion of the oxide in the LOCOS isolation structures 20 of the isolation regions 26 in the high voltage peripheral circuit region 18. Such an oxide etch can be performed using any conventional oxide etching process such as an anisotropic etch. Initially, resist material is applied and patterned to cover the structure, except for the exposed portions of the LOCOS isolation structures 20, using photolithography techniques for example. The oxide is then etched and the resist removed. The result is that only portions 20a of the LOCOS isolation structure 20 remain in the high voltage peripheral region 18.

Next, as represented in FIG. 2d, a silicon etch is performed so as to form simultaneously trenches 28 within the substrate 12 in the isolation regions 26 for both the core region 14 and the high voltage peripheral region 18. Specifically, a trench resist material is applied to cover the structure and is then patterned to expose the isolation regions 26 in the regions 14 and 18. Trenches 28 are then etched into the substrate 12 using conventional techniques. The trench resist material is then stripped from the structure so as to result in the structure shown in FIG. 2d.

Following the formation of the trenches 28 via the silicon etch as represented in FIG. 2d, an oxide layer 34 is formed on the structure using high-density-plasma CVD (HDPCVD) in order to fill the isolation regions 26 fully as shown in FIG. 2e. As is known, HDPCVD is a self-planarizing process, thus reducing the chemical mechanical polishing (CMP) times required in subsequent steps. (See, e.g., Pye, J. T. et al., *High-density plasma CVD and CMP for 0.25-$\mu m$ intermetal dielectric processing,* Solid State Technology, December 1995, pgs. 65–71). Following formation of the oxide layer 34, the oxide layer 34 is removed, preferably by chemical mechanical polishing (CMP), down to the level of the surface of the nitride layer 24 as shown in FIG. 2f. Consequently, the oxide material 34a which made up part of the layer 34 remains in the isolation regions 26. The upper surface of the oxide material 34a is substantially even with the upper surface of the nitride layer 24.

As is represented in FIG. 2g, a nitride strip process is then performed to strip away the remaining nitride layer 24 and barrier oxide layer 22. Such nitride layer strip also results in the top surface of the oxide material 34a being etched to a level substantially even with the top surface of the substrate 12. The oxide material 34a in each of the trenches 28 formed in the high voltage peripheral region 18 is sandwiched between the portions 20a of the remaining LOCOS isolation structure 20, representing a combination LOCOS/STI isolation structure. This combination LOCOS/STI isolation structure provides improved isolation beyond that provided by either the STI structure and LOCOS structure individually. Thus, the combination LOCOS/STI isolation structure is particularly suited for use in the high voltage region 18.

Accordingly, the steps represented by FIGS. 2a–2g illustrate a process in which STI structures 40 (FIG. 2g) may be formed in the core region 14; LOCOS isolation structures 42 may be formed in the low voltage peripheral region 16; and combination LOCOS/STI isolation structures 44 may be formed in the high voltage region 18. Notably, many processing steps which would otherwise have to be performed separately may be performed concurrently in providing the different isolation structures in accordance with the invention. Consequently, different structures, particularly a combination LOCOS/STI isolation structure for use in high voltage circuits, are provided without substantially increasing a number of processing steps and/or complexity of manufacture.

Although the invention has been shown and described with respect to certain preferred embodiments, it is obvious that equivalents and modifications will occur to others skilled in the art upon the reading and understanding of the specification. For example, temperatures, times, and suggested processing technologies are provided throughout the context of the present description. It should be understood, however, that the particular times, temperatures and technologies may be varied in accordance with well-known principles of semiconductor processing, and that such variances are to be considered within the scope of the invention.

The present invention includes all such equivalents and modifications, and is limited only by the scope of the following claims.

What is claimed is:

1. An integrated circuit on a semiconductor substrate, the integrated circuit including
    a first isolation structure including a first trench in a surface of the substrate with isolation material formed within the first trench,
    a second isolation structure including a first local oxidation of silicon (LOCOS) isolation structure, and
    a third isolation structure including a second LOCOS isolation structure and a second trench, the second trench formed in the surface of the substrate and interposed between and contacting portions of the second LOCOS isolation structure with isolation material formed within the second trench,
    wherein the first and second trenches comprise substantially vertical sidewalls.

2. The integrated circuit of claim 1, wherein the second trench extends below a bottom portion of the second LOCOS isolation structure.

3. The integrated circuit of claim 1, wherein the isolation material formed within the first and second trenches comprises an oxide.

4. The integrated circuit of claim 1, wherein the isolation material formed within the second trench is substantially even with an upper surface of the LOCOS isolation structure.

5. The integrated circuit of claim 1, wherein a single isolation material layer forms both the isolation material formed within the first trench and the isolation material formed within the second trench.

6. An integrated circuit on a semiconductor substrate, the integrated circuit including a first isolation structure including a first trench in a surface of the substrate with isolation material formed within the first trench, a second isolation structure including a first local oxidation of silicon (LOCOS) isolation structure, and a third isolation structure including a second trench in the surface of the substrate interposed between portions of a second LOCOS isolation structure with isolation material formed within the second trench, wherein a single isolation material layer forms both the isolation material formed within the first trench and the isolation material formed within the second trench, wherein the isolation material formed within the first trench is substantially even with an upper surface of the semiconductor substrate.

7. An integrated circuit having a core region, a low voltage peripheral region and a high voltage peripheral region, and having a plurality of device structures in each region, wherein one or more of the device structures in the core region is isolated from another device structure in the core region by a shallow trench isolation structure, wherein the shallow trench isolation structure comprises a first trench, wherein one or more of the device structures in the high voltage peripheral region is isolated from other device structures in the high voltage peripheral region with a combined LOCOS/shallow trench isolation structure, wherein the LOCOS/shallow trench isolation structure comprises:
- a LOCOS structure in a substrate;
- a second trench having a substantially vertical sidewall formed in the LOCOS structure, wherein the second trench extends below a bottom portion of the LOCOS structure; and
- a single isolation material layer forms both the first trench and the second trench.

8. The integrated circuit of claim 7, wherein the plurality of device structures form a floating gate type memory device, the floating gate type memory device having stacked gate transistors for storing data, low voltage transistors for providing a row decoder operation for the stacked gate transistors, and high voltage transistors for providing reading and writing operations to and from the stacked gate transistors, wherein the combined LOCOS/shallow trench isolation structure isolates at least two of the high voltage transistors from one another.

9. The integrated circuit of claim 7, wherein the isolation material comprises an oxide.

10. The integrated circuit of claim 7, wherein the isolation material formed within the first and second trenches comprises an oxide.

11. The integrated circuit of claim 7, wherein the LOCOS structure is a field oxide and the isolation material is another oxide.

12. The integrated circuit of claim 7, wherein the isolation material formed within the first trench and the isolation material formed within the second trench is a same isolation material.

13. An integrated circuit on a semiconductor substrate, the integrated circuit including a first isolation structure including a first trench in a surface of the substrate with isolation material formed within the first trench, a second isolation structure including a first local oxidation of silicon (LOCOS) isolation structure, and a third isolation structure including a second trench having a substantially vertical sidewall in the surface of the substrate interposed between portions of a second LOCOS isolation structure with isolation material formed within the second trench, wherein an isolation material layer forms both the isolation material formed within the first trench and the isolation material formed within the second trench, and wherein the circuit is an electrically erasable programmable read-only memory (EEPROM) and the third isolation structure is formed between active devices in a high voltage peripheral circuit region, the first isolation structure is formed in a core region, and the second isolation structure is formed in a low voltage peripheral circuit region.

* * * * *